United States Patent [19]
Slocum et al.

[11] Patent Number: 5,821,764
[45] Date of Patent: Oct. 13, 1998

[54] INTERFACE APPARATUS FOR AUTOMATIC TEST EQUIPMENT

[75] Inventors: Alexander H. Slocum, Concord, N.H.; Michael A. Chiu, Medford, Mass.

[73] Assignee: Aesop, Inc., Bow, N.H.

[21] Appl. No.: 947,682

[22] Filed: Sep. 29, 1997

Related U.S. Application Data

[60] Continuation of Ser. No. 463,227, Jun. 5, 1995, abandoned, which is a division of Ser. No. 299,831, Sep. 1, 1994, abandoned.

[51] Int. Cl.[6] .................................................. G01R 31/02
[52] U.S. Cl. ............................ 324/758; 324/754; 403/52
[58] Field of Search .................................... 324/754–758; 403/52, 83

[56] References Cited

U.S. PATENT DOCUMENTS

| | | | |
|---|---|---|---|
| 3,609,539 | 9/1971 | Gunthert | 324/72.5 |
| 4,055,805 | 10/1977 | Ardezzone | 324/756 |
| 4,357,575 | 11/1982 | Uren et al. | 324/758 |
| 4,443,756 | 4/1984 | Lightbody et al. | 324/761 |
| 4,610,020 | 9/1986 | La Fiandra | 378/35 |
| 4,665,360 | 5/1987 | Phillips | 324/158 |
| 4,751,457 | 6/1988 | Veenendaal | 324/158 |
| 4,899,107 | 2/1990 | Corbett et al. | 324/765 |
| 4,987,365 | 1/1991 | Shreeve et al. | 324/758 |
| 5,015,946 | 5/1991 | Janko | 324/754 |
| 5,068,601 | 11/1991 | Parmenter | 324/158 |
| 5,414,369 | 5/1995 | Kazama | 324/758 |
| 5,469,074 | 11/1995 | Drabenstadt et al. | 324/758 |
| 5,530,375 | 6/1996 | Seidel | 324/761 |
| 5,559,444 | 9/1996 | Farnworth et al. | 324/754 |

FOREIGN PATENT DOCUMENTS

0260024A2  3/1988  European Pat. Off. .

*Primary Examiner*—Enrest F. Karlsen
*Assistant Examiner*—Russell M. Kobert
*Attorney, Agent, or Firm*—Edmund J. Walsh

[57] ABSTRACT

An interface between a test head portion of automatic test equipment and a handling device such as a prober. The interface employs preloaded kinematic couplings between the test head and the handling device and between the probe card and the test head. These couplings allow the probe card to be repeatedly positioned relative to the component in the handling device. They also reduce forces on the probe card to prevent distortion of the probe card. The interface provides separate mechanical and electrical loops such that mechanical precision is not dependant on the electrical structure.

7 Claims, 6 Drawing Sheets

INTERFACE APPARATUS FOR AUTOMATIC TEST EQUIPMENT

This application is a continuation of application Ser. No. 08/463,227 filed on Jun. 5, 1995, now abandoned which is a divisional of application Ser. No. 08/299,831 filed on Sep. 1, 1994, now abandoned.

This invention relates generally to automatic test equipment and more specifically to apparatus for interfacing automatic test equipment to devices which position semiconductor devices for testing.

During the manufacture of semiconductor components, the components are tested at various stages. Manufacturers have significant economic incentive to detect and discard faulty components as early in the manufacturing process as possible. For example, numerous semiconductor integrated circuits are usually fabricated on a large silicon wafer. The wafer is cut and the integrated circuits are separated into dies. The dies are then mounted into frames. Bond wires are attached to connect the die to leads which extend from the frame. The frame is then encapsulated in plastic or other packaging matreial, producing a finished product.

This manufacturing process is relatively expensive. Accordingly, most semiconductor manufacturers test each integrated circuit on the wafer before the wafer is cut. The defective integrated circuits are marked and discarded after the wafer is cut. In this way, the cost of packaging the defective dies is saved. As a final check, most manufacturers test each finished product before it is shipped. Manufacturers who guarantee that a very high percentage of the semiconductor components delivered to their customers will function properly can charge higher prices for their products.

Semiconductor components are generally produced in large quantities. To rapidly test large quantities of components, automatic test equipment (generally "testers") are used. A tester rapidly generates input signals for application to the integrated circuit and can determine whether the appropriate response signals are generated. Because testers are highly automated, they can run through a series of millions of test cases in a few seconds.

To efficiently test integrated circuits, some device is needed to move and quickly connect the device being tested to the tester. To move wafers, a device called a "prober" is used. To move packaged parts, a device called an "handler" is used. These devices precisely position the component being tested so that it makes electrical contact with outputs of the tester. Probers, handlers and other devices for positioning a device under test relative to the test head are called generically "handling devices."

Connecting the handling device to the tester poses several challenges. First, semiconductor circuits have many inputs and outputs. Typical circuits might have between 20 and 100 inputs and outputs. However, some larger circuits have as many as 500 inputs and outputs and circuits with over 1,000 inputs and outputs are being contemplated. Thus, the tester must generate and receive hundreds of signals. The electronic circuitry needed for driving and receiving these signals must be as close to the device being tested as possible to allow high speed operation.

Consequently, most testers are designed with a test head that includes all of the driving and receiving circuitry. The test head is connected via a cable bundle to an electronics cabinet which contains data processing circuitry which determines which signals should be driven and compares the received signals to expected values.

The test head can be up to a few feet in diameter in order to hold all of the driving and receiving circuitry. The device being tested is on the order of a square inch in the case of a finished product and is even smaller in the case of an integrated circuit on a wafer. To make electrical contact, the hundreds of signals leaving the test head must be squeezed into a very small area.

Figure 1A:
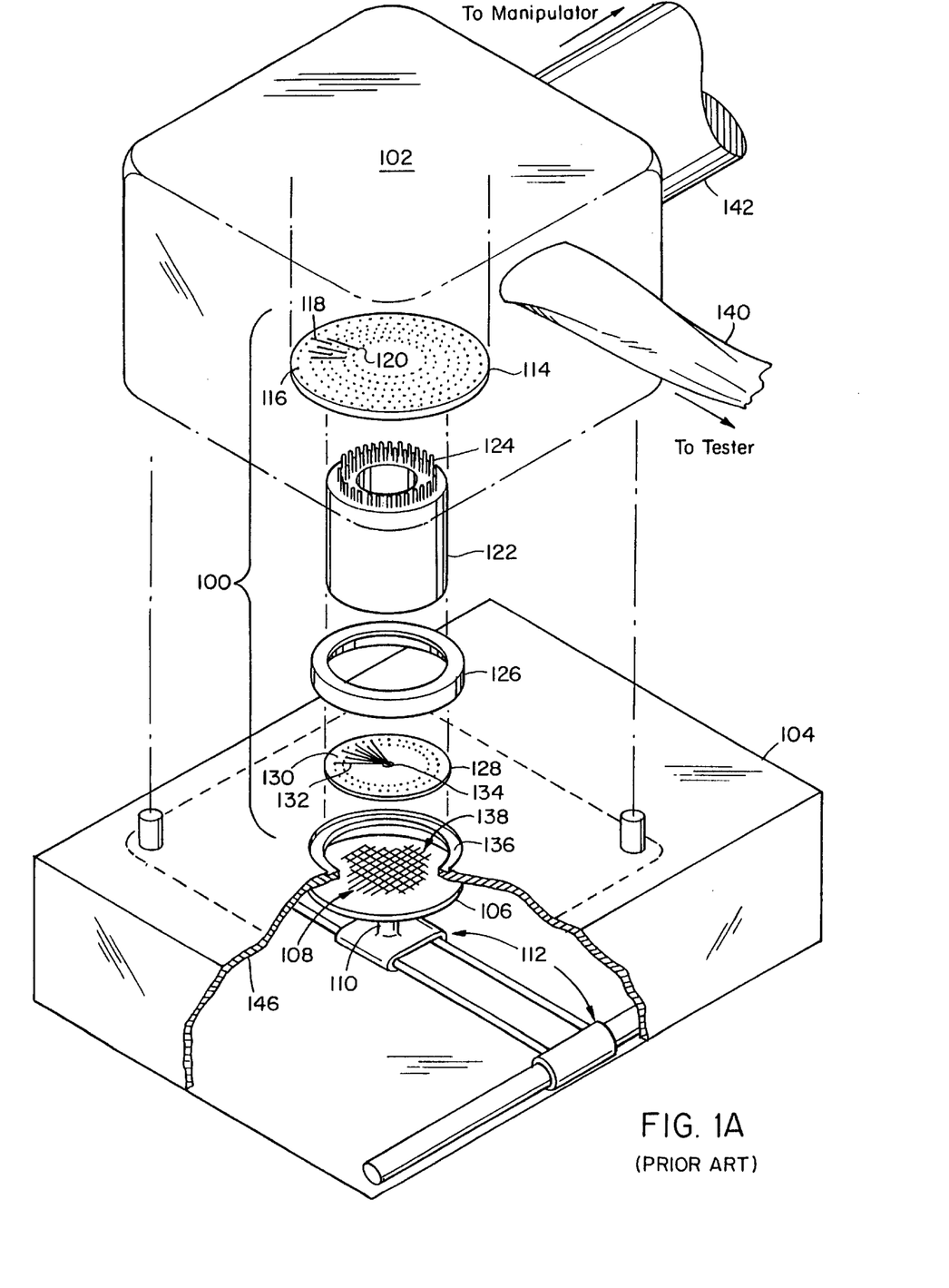
FIG. 1A is an exploded view of a prior art interface between a test head and a prober.
Figure 1B:
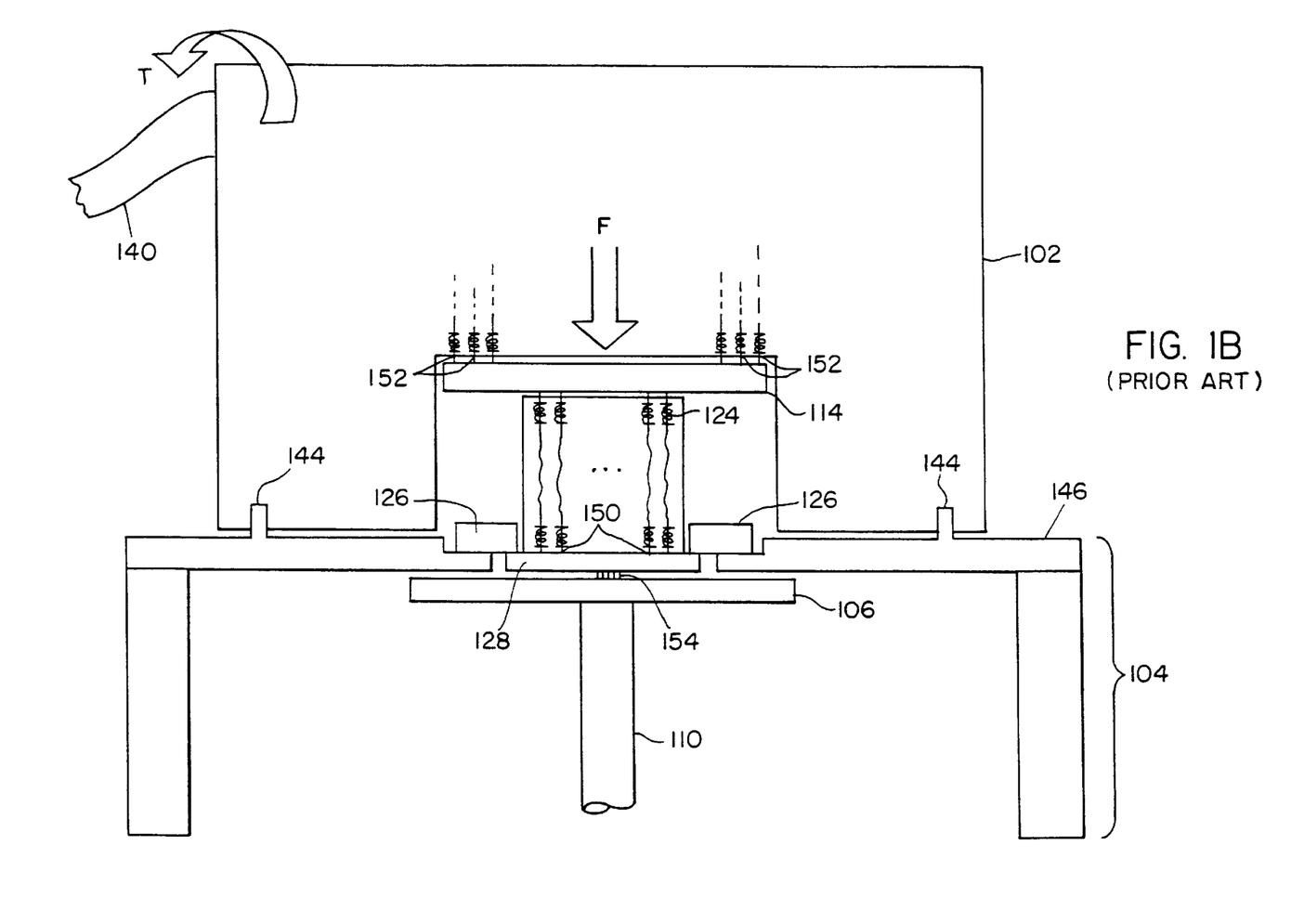
FIG. 1B is a cross sectional view of FIG. 1A.

FIG. 1A shows a test head 102 connected to a prober 104 through an interface 100. Signals are connected to the electronics in test head 102 via spring pins 152 (FIG. 1B). Spring pins are conducting pins which are spring loaded so that when a conducting surface is pressed against the pins, a good electrical contact is made.

A device interface board 114 is pressed against the spring pins 152 (FIG. 1B) in test head 102. Device interface board 114 is a multilevel printed circuit board. It includes on its upper level contact pads 116. One of the spring pins 152 (FIG. 1B) presses against each contact pad 116 to route signals from test head 102 onto device interface board 114. Device interface board 114 might also contain electronic components (not shown) needed to electrically interface the circuitry inside test head 102 to a specific device being tested.

On device interface board 114, conductive traces 118 route the signals towards via holes 120 at the center of the board. Via holes 120 provide a conducting signal path to the bottom of device interface board 114. Further contact pads (not shown) are positioned on the bottom of device interface board 114.

Spring pins 124 in an extension collar 122 make contact to the contact pads (not shown) on the bottom of device interface board 114. Extension collar 122 also includes spring pins 150 (FIG. 1B) on its lower surface. The spring pins 124 and 150 (FIG. 1B) are electrically connected inside extension collar 122 so that the electrical signals are passed through extension collar 122.

Spring pins 150 (FIG. 1B) press against contact pads 130 on probe card 128. Probe card 128 is also a multilevel printed circuit board. Contact pads 130 are connected to conductive traces 132 which route signals to via holes 134. Via holes 134 carry the signals to the bottom of the probe card 128. Via holes 134 are connected to probe wires 154 (FIG. 1B).

Probe card 128 is mounted in probe card stiffener 126. Probe card stiffener 126 mechanically reinforces probe card 128. Probe wires 154 (FIG. 1B) are precision manufactured such that their ends are all in the same plane. Deflection of probe card 128 would decrease this precision. Probe card stiffener 126 reduces deflection.

Probe card stiffener 126 rides on ledge 136 in upper surface 146 of prober 104. Probe card stiffener 126 is fixedly attached to upper surface 146 so that probe wires 154 (FIG. 1B) are in a fixed position relative to prober 104.

Inside prober 104, a chuck 110 holds a silicon wafer 106. Silicon wafer 106 has fabricated on its upper surface numerous integrated circuits 108.

Chuck 110 is attached to X-Y positioning system 112. Wafer 106 can be moved such that each of the integrated circuits 108 can be contacted in turn with probe wires 154 (FIG. 1B). Prober 104 can position wafer 106 with great precision. In addition, probers typically perform a calibration routine which allows the prober to determine the location of probe wires 154 such that prober 104 also operates with great accuracy as long as no portions of interface 100 move after the calibration routine is run.

One difficulty with such an arrangement, though, is that it is often necessary to change the device interface board 114 or probe card 128. A different device interface board or probe card is likely to be needed to test different types of components or to conduct different tests on the same type of component. To make the change, it is necessary that test head 102 be removed from prober 104.

Test head 102 is a large device and can weigh in excess of 500 pounds. To facilitate movement, test head 102 is attached to a manipulator (not shown) via support arm 142. The manipulator contains counterweights or other mechanical devices to make movement of test head 102 easier. The manipulator might also be calibrated such that when test head 102 is moved, it can be returned as closely as possible to the same location given its design and the tolerances in manufacture. Guide posts 144 on prober 104 also aid in returning test head 102 to its original position.

If, when test head 102 is repositioned, it is not in exactly the same place, the forces exerted on prober card 128 and upper surface 146 will be different than before the test head was moved. If the forces are sufficiently different, probe card 128 or upper surface 146 will deflect enough that probe wires 154 will move relative to wafer 106. Sources of force are shown in FIG. 1B. Test head 102 must press against interface 100 (FIG. 1A) with sufficient force that spring pins 124, 150 and 152 make good electrical contact. Locking rings (not shown) or other mechanical arrangements have been used to compress some of the spring pins. For example, a locking ring could be used to pull all the pieces of interface 100 together. However, one set of spring pins must always be compressed by a force F which pushes down on upper surface 146.

Another source of force comes from cable 140. Cable 140 is very heavy and may weigh hundreds of pounds. Cable 140 is very inflexible as it could be as large as twelve inches in diameter. It hangs off of test head 102 and applies a torque T. Because of the inflexible nature of the cable, it exhibits what is called an "hysteresis effect." Even if cable 140 is returned to exactly the same position, the torque applied to test head 102 might change after cable 140 is moved.

Any changes in these force can cause small deflections in probe card 128 or upper surface 146. Movement of less than one thousandth of an inch is sufficient to require recalibration of prober 104. As recalibration typically takes around twenty minutes, it would be highly desirable if test head 102 could be moved and repositioned such that it returned to the same location and exerts the same amount of force on probe card 128 and upper surface 146.

Further, a calibration routine can only adjust for a displacement of test head 102 into a plane which is parallel to the upper surface of wafer 106. This plane is sometimes called the X-Y plane. If test head 102 is tilted relative to the X-Y plane; some of the probe wires 154 might not contact wafer 106. Likewise, if probe card 128 is distorted by force F or torque T such that the tips of probe wires 154 are no longer coplanar, some of the probe wires 154 will not contact wafer 106 in the appropriate places. Existing calibration routines can not compensate for these error sources. Accordingly, to achieve greater accuracy, it is necessary that any interface hold probe card 128 as flat and as parallel as possible to wafer 106.

We have identified a second problem associated with moving test head 102. Contact pads or spring pins are sometimes damaged as test head 102 is repositioned. If test head 102 is first moved perpendicularly to upper surface 146 such that the spring pins are pressed against their contact pads and then moved parallel with upper surface 146, the spring pins will drag across the contact pads. If there is sufficient loading on the spring pins, the contact pads or spring pins will be damaged. Accordingly, it is desirable that the positioning system only allow motion of the test head perpendicular to upper surface 146 as test head 102 gets close to its final position.

SUMMARY OF THE INVENTION

With the foregoing background in mind, it is an object of the invention to provide an improved interface for automatic test equipment.

It is also an object to provide a mechanical interface between a test head and a handling device which precisely and repeatedly positions an electrical interface relative to the handling device.

It is another object to provide a mechanical interface between a test head and a handling device which provides constant force between the test head and the handling device.

It is still a further object to provide a mechanical interface between two bodies which allows only perpendicular motion The foregoing and other objects are achieved by an interface involving kinematic coupling between the test head and the handling device. In one embodiment, the kinematic coupling is provided by curved components which mate with grooves. In a preferred embodiment, the curved components have posts extending therefrom which extend through holes in the grooves and are pulled with a constant force.

In another embodiment, a second kinematic coupling is used to mount a holder for the probe card to the test head.

In yet another embodiment, electrical contact is made between elements of the interface via zero insertion force sockets.

According to another feature of the invention, a mechanical coupling between two objects is formed from a kinematic surface mounted on each object with a body having two kinematic mating surfaces disposed between the kinematic surfaces. One mating surface faces each kinematic surface. The body is constrained to move in only one direction relative to one of the mating surfaces.

BRIEF DESCRIPTION OF THE DRAWINGS

The invention may be better understood by reference to the following more detailed description and accompanying drawings in which.

DESCRIPTION OF THE PREFERRED EMBODIMENT STRUCTURE

Figure 2A:
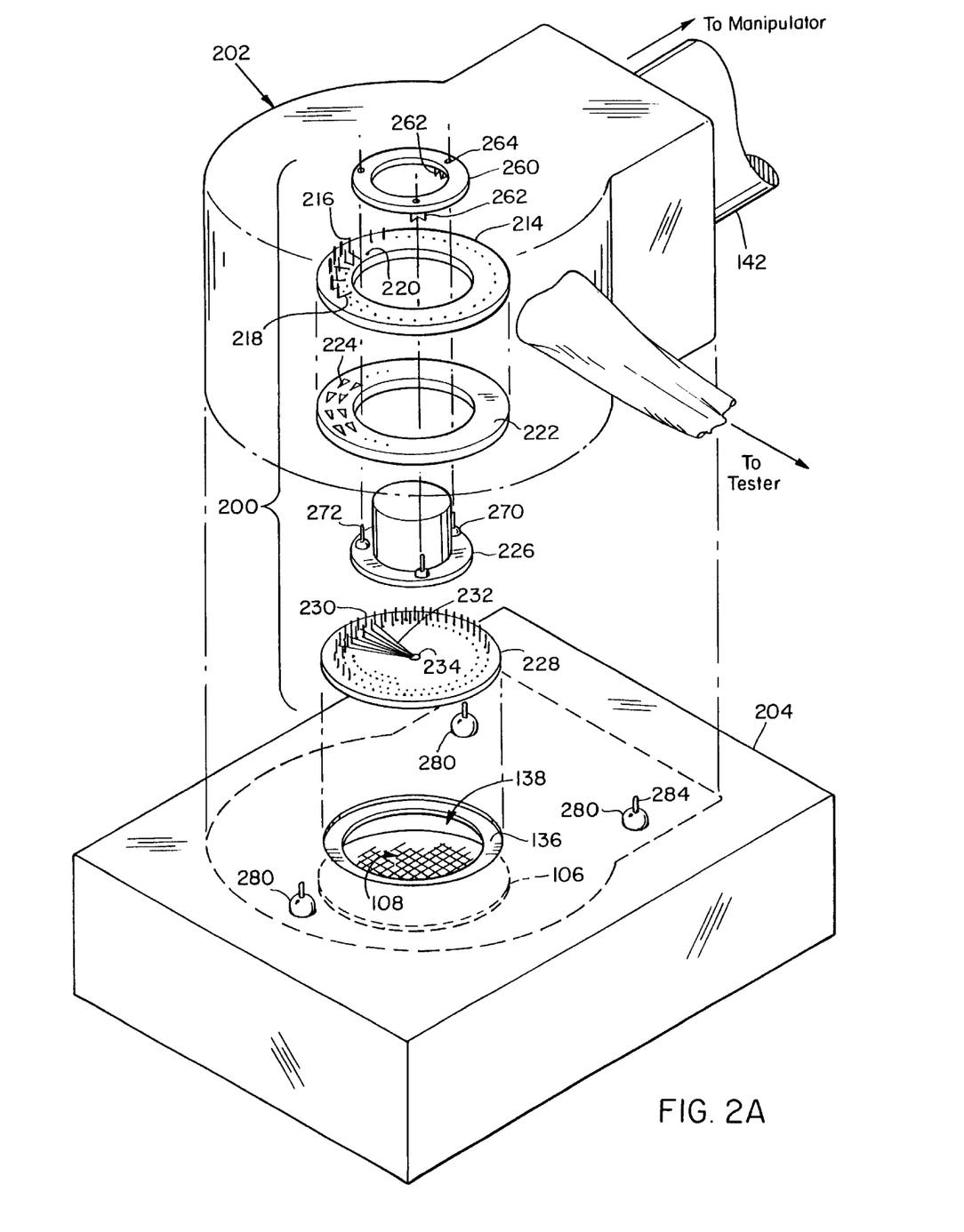
FIG. 2A is an exploded view of an interface according to the invention between a test head and a prober.

Turning now to FIG. 2A, a test head 202 is shown interfacing with a handling device, such as prober 204. Interface 200 includes a device interface board 214, as in the prior art. However, unlike the prior art, device interface board 214 contains a plurality of electrically conductive posts 216. Signals from test head 204 are passed onto device interface board 214 through posts 216.

Posts 216 are connected to traces 218. Traces 218 carry signals to via holes 220. Via holes 220 carry the signals to the lower surface (not shown) of device interface board 214 and connect to posts 252 (FIG. 2B).

Zero insertion force ring 220 is mounted below device interface board 214. Zero insertion force ring 220 contains holes 224 which receive posts 252. Within the holes 224, there are conductive plates 258 (FIG. 2B). Plates 258 are positioned such that posts 252 do not contact them when zero insertion force ring 220 is rotated into a first position. In this way, there is virtually no resistance to the insertion of posts 252 into holes 224. However, plates 258 are arranged such that when zero insertion force ring 222 is rotated, posts 252 make electrical contact with plates 258.

Probe card 228 is also included in interface 200. Probe card 228 contains posts 230. Posts 230 are align with holes (not shown) on the underside of zero insertion force ring 220. Zero insertion force ring 220 contains plates 256 (FIG. 2B) which are positioned to electrically contact posts 230 when zero insertion force ring 220 is rotated.

Figure 2B:
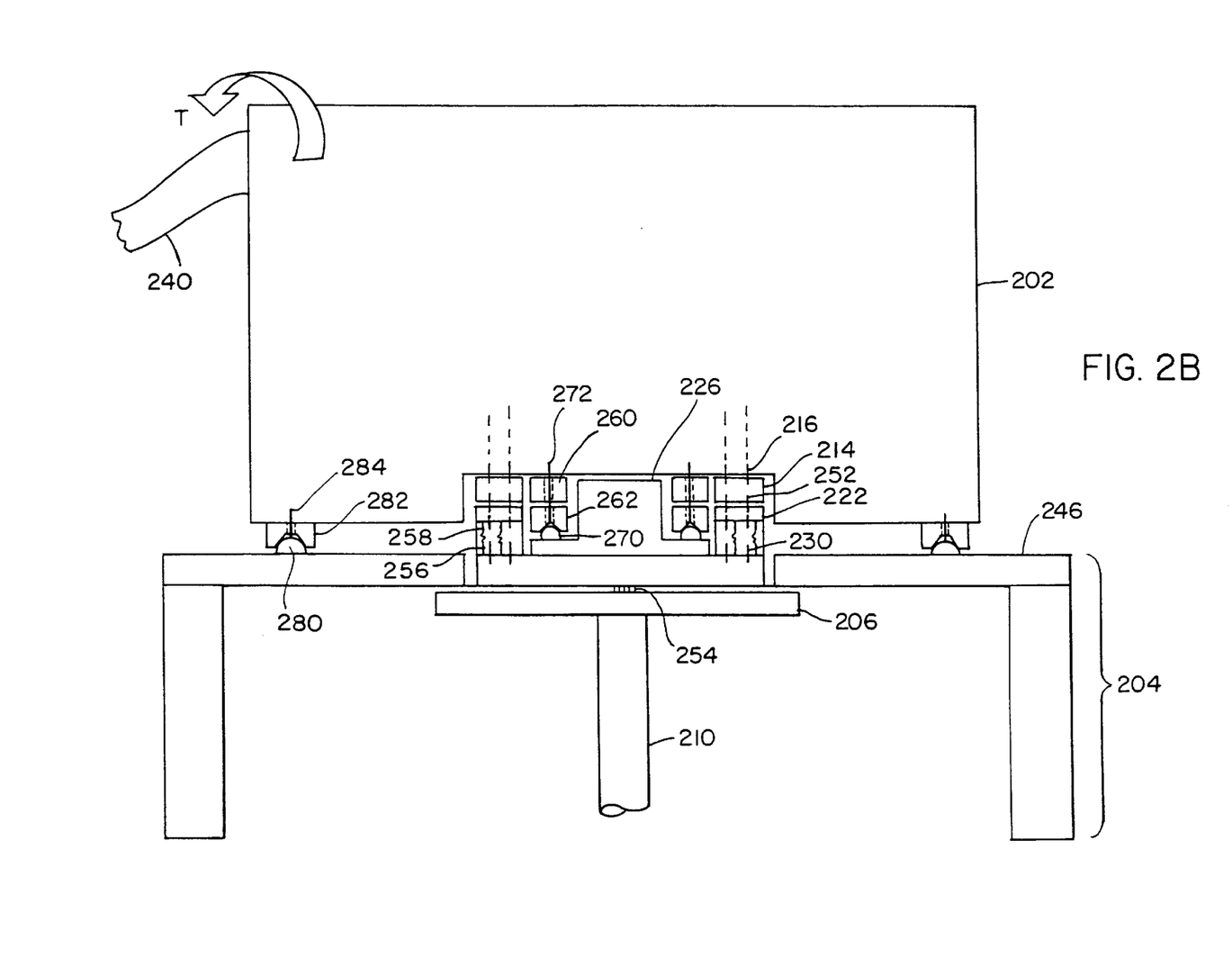
FIG. 2B is a cross sectional view of FIG. 2A.

As shown in FIG. 2B, plates 256 and 258 are connected together. Thus, when zero insertion force ring 220 is rotated, electrical paths are created for signals from device interface board 214 to probe card 228. Though only a limited number of such conducting signal paths are shown, a typical tester will generate hundreds to over one thousand signals and a separate path is needed for each. Pins 216 on device interface card 214 could also be connected to test head 202 through a zero insertion force ring.

To complete the signal path, the signals are coupled over traces on probe card 228 to via holes 234. The signals pass through via holes to the underside (not shown) of probe card 228. Via holes 234 are connected to probe wires 254 (FIG. 2B) which contact wafer 206.

Interface 200 provides electrical coupling from test head 202 to wafer 206. Because spring pins are not used, no force perpendicular to upper surface 246 is required to establish the connection.

Probe card 228 is attached to probe card holder 226. Any convenient means of attachment can be used. For example, probe card 228 could be screwed to holder 226. Examples of other suitable methods of attachment are epoxy and snap fit coupling.

Probe card holder 226 includes three balls 270. Posts 272 extend through the center of balls 270. Balls 270 are designed to contact grooved blocks 262 mounted to positioning ring 260. Balls 270 and grooved blocks 262 are machined from a rigid, hard material. Hardened stainless steel is one example of a suitable material. Silicon carbide or silicon nitride could also be used, but are more difficult to machine. Grooved blocks 262 and balls 270 mate to form a kinematic coupling which precisely and repeatably positions probe card 228 relative to test head 202. Kinematic coupling is described in greater detail below.

Positioning ring 260 is mounted to test head 202 in a manner described in greater detail below. Posts 272 are designed to pass through holes 264 in positioning ring 260. Holes 264 should be sufficiently large that posts 272 do not touch the sides of holes 264. Posts 272 engage a linear actuator 346 (FIG. 3), which holds probe card holder 226 to test head 202 with a constant force. That force is constant regardless of the position of test head 202.

Test head 202 has mounted on its lower surface three grooved blocks 282 (FIG. 2B). Grooved blocks 282 receive balls 280 mounted on upper surface 246 of prober 204. Grooved blocks 282 and balls 280 are machined from a rigid, abrasion resistant material, such as stainless steel.

Pins 284 pass through holes in grooved blocks 282 and engage a linear actuator 346 (FIG. 3) in test head 202. Linear actuator 346 holds test head 202 to prober 204 with a constant force.

ASSEMBLY

Grooved blocks 262 and 282 are made separately. Likewise, balls 270 and 280 are made separately. These pieces are preferably machined to tight tolerances (+/− 0.0001" with a surface roughness of 0.00001" or better. Posts 272 and 284 need not be manufactured with the same tight tolerances. They are manufactured separately and then attached to balls 270 and 280. One suitable means of attachment is be threading the ends of posts 272 and 284 and then screwing them into a threaded hole in balls 270 and 280.

Grooved blocks 282 are affixed to the lower surface of test head 202 in any convenient, rigid manner. For example, screws can be used. For greater stability, grooved blocks 282 are mounted as close to the periphery of test head 202 as possible. As a kinematic coupling will form a stable and repeatable attachment regardless of the exact position of the contacts, the positioning of grooved blocks 282 is not critical. For ease of assembly, it is preferable if the kinematic couplings are attached to the lower surface of test head 202 while it is detached from the rest of the test head.

Next, positioning ring 260 is produced. As it is much smaller than the entire test head, grooved blocks 262 could be formed as part of ring 260 or could be separately formed and then attached, such as with screws, to ring 260. To ensure that probe card holder 226 and hence probe card 228 are parallel to upper surface 246, it is necessary that grooved blocks 262 be mounted parallel to grooved blocks 282. To ensure proper positioning, a precision manufactured jig is used. The jig is made on a very stable, flat surface as is customarily used in the manufacture of precision equipment. Three posts with spherical ends are mounted on the surface to mate with the grooves in grooved blocks 282. The heights of the posts of the jig are carefully controlled to be the same such that the lower surface of test head 202 is parallel with the flat surface of the jig. Another set of three balled posts is mounted on the flat surface of the jig. The heights of these posts are also carefully controlled to be the same height such that when positioning ring 260 is placed on the posts it will be precisely parallel to the flat surface of the jig and hence parallel to the lower surface of test head 202.

Positioning ring 260 is manufactured to be slightly smaller than the opening in test head 202 into which it fits. A clearance of 0.3" is used in the preferred embodiment, but the exact dimension is not critical. To hold positioning ring 260 in the right location, positioning ring is potted in epoxy or other suitable replicant. Epoxy of the type used as a replicant in the machine tool industry is suitable.

Probe card holder 226 is separately manufactured. Because probe card holder 226 is relatively small, it is possible to position balls 270 using traditional high precision manufacturing techniques without the use of a separate jig. Also, balls 270 do not need to be positioned with high accuracy because the probe wires on probe card 228 are planarized, using known techniques, while probe card 228 is mounted in probe card holder 226. Thus, any skew of probe card holder 226 relative to upper surface 246 introduced by inexact placement of balls 270 in the planarization process.

Prober 204 may be manufactured separately and balls 280 may be mounted after prober 204 is manufactured. Again, the exact plane above upper surface 246 where balls 280 mate with grooved blocks 282 is not critical. Accordingly, special procedures do not need to be employed to mount balls 280. As shown in greater detail in conjunction with FIG. 3, balls 280 are not fully spherical. Rather, posts are machined at one end to have one spherical end. The other end of the post could then be threaded for attachment to prober 204. Other methods of attachment could be used. For example, screws could be inserted through upper surface 246 to hold balls 280.

Prober 204 can easily compensate for displacements of probe card 228 in the plane of upper surface 246 (the X-Y plane). Prober 204 can not, however, compensate for the fact that probe card 228 is not parallel to upper surface 246. Therefore, the heights of balls 280 above upper surface is important to achieve the accuracy desired for the preferred embodiment.

One way to achieve this accuracy is to make the relative heights of balls 280 adjustable. Commercially available probers generally have an upper surface which may be adjusted. If balls 280 are mounted to upper surface 246, proper positioning can be attained by simply adjusting upper surface 246. The adjustment may be made with the aid of a precision manufactured adjustment jig.

A suitable jig would have 3 grooves positioned on a flat plate like the grooves in grooved blocks 282 mounted to the underside of test head 202. In the center of the jig, three displacement transducers would be mounted with their tips located in a plane parallel with the flat plate of the jig. The tips of the displacement transducers would point downwards towards a test surface mounted in chuck 210. Upper surface 246 would then be adjusted until all three displacement transducers had the same reading. Such a condition indicates that the tops of balls 280 define a plane parallel to the piece on chuck 210.

Alternatively, it is not necessary that a separate jig be constructed to adjust the heights of balls 280. If probe card 228 were replaced by a fixture holding three displacement transducers, it would function exactly as the jig described above.

Also, it is not necessary that a prober having an adjustable upper surface be used. It might be preferable to mount balls 208 to the frame of prober 204 as the frame is less likely to move than the upper surface and allows the balls to be more widely spaced for greater stability. If balls 208 are mounted directly to the frame or are mounted to a prober without an adjustable upper surface, it is preferable that they be mounted with some means that allows adjustment of their height. For example, they could be mounted with micrometer head screws.

OPERATION OF KINEMATIC COUPLING

Kinematic coupling is well known. It is described in reference texts such as *Precision Machine Design* by Alexander H. Slocum, Prentice Hall 1992 and in papers such as A. Slocum, *Kinematic Coupling For Precision Fixturing—Part 1: Formulation of Design Parameters*, Precis. Eng., Vol. 10 No. 2, 1988; A. Slocum and A. Donmez, *Kinematic Couplings for Precision Fixturing*—Part 2: *Experimental Determination of Repeatability and Stiffness*, Precis. Eng., Vol. 10, No. 3, 1988; and *Design of Three-Groove Kinematic Couplings* by Alexander H. Slocum, Precis. Eng., pp 67–75, 1992, all of which are hereby incorporated by reference. Briefly, the theory behind kinematic coupling is that to accurately position a body, it should be contacted at the fewest number of points needed to constrain motion in all degrees of freedom in which motion is to be prohibited. To constrain motion in the six degrees of freedom, six contact points are needed, provided that no more than two of the contact points are colinear.

In the preferred embodiment, three balls are mated in three grooves. Each groove has two surfaces, each of which contacts a ball at only one point. Thus, the combination of three balls and three groves forms a kinematic coupling sufficient to restrain motion in the six degrees of freedom.

In the preferred embodiment, the grooves are as widely spaced as practical. In addition, the grooves are oriented to provide the greatest possible stability according to the techniques detailed in the aforesaid references.

Each pair of a ball and groove is termed a "kinematic contact" because the pair provides some of the contacts needed to form the kinematic coupling. Each side of a groove is termed a "kinematic surface" because it provides for contact at a single point. The ball is called a "kinematic mating surface" because it contacts a kinematic surface at only one point. For satisfactory operation of a kinematic coupling, it is not necessary that grooves be used to form the kinematic surfaces. Other shapes, such as a gothic arch, can be used as well. It is also not necessary that a ball be used as the kinematic mating surface. Other shapes, such as the tip of a cone, can be made to contact a surface at a single point. Likewise, it is not necessary that each kinematic contact include two kinematic surfaces. Examples of other suitable kinematic contacts are: a ball pressing against a flat surface (one kinematic surface per contact); a ball pressing against a tetrahedron (three kinematic surfaces per contact) or a ball pressing against three balls (three kinematic surfaces per contact). Different types of contacts may be used in one coupling as long as there are six kinematic surfaces in total.

Figure 3:
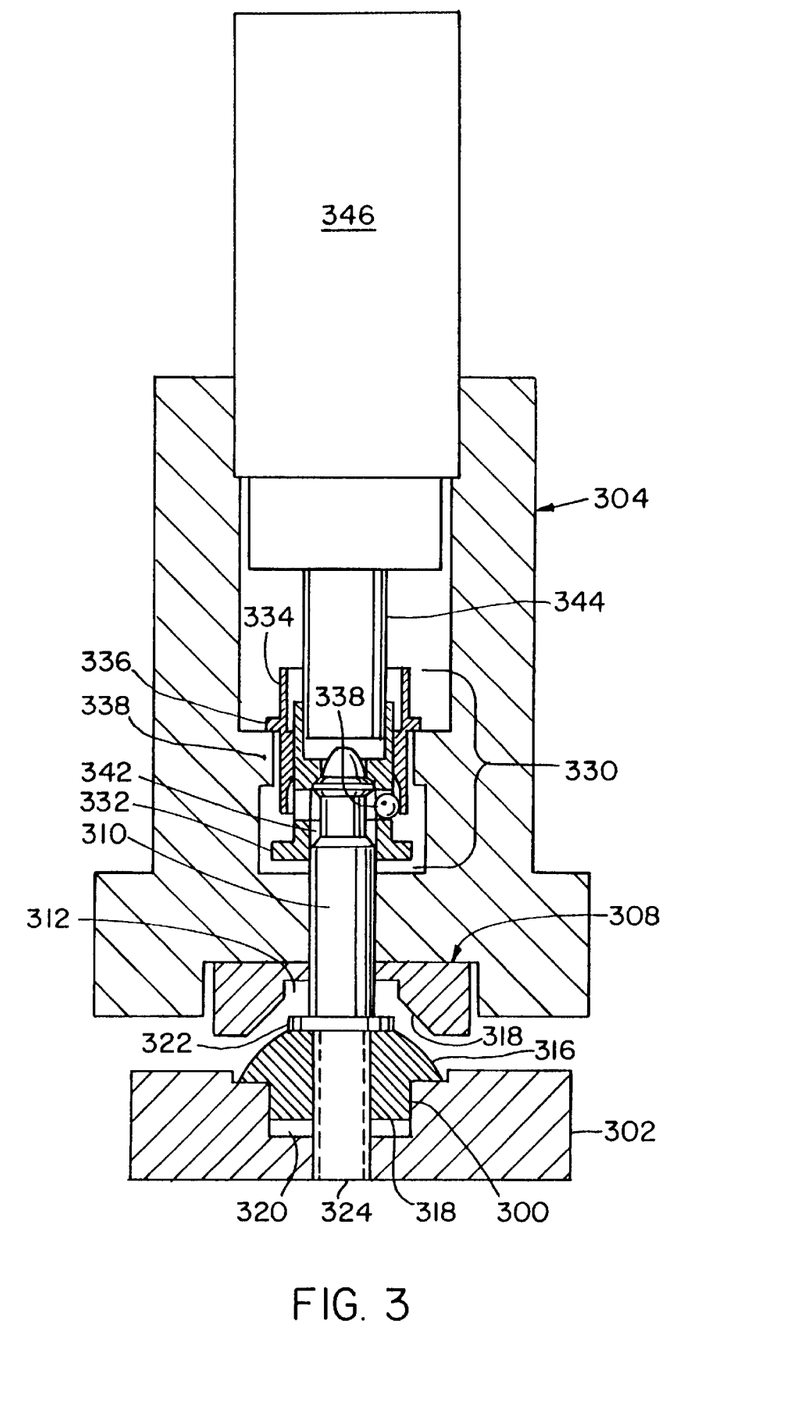
FIG. 3 is a cross sectional view of a coupling according to one embodiment of the invention.

Turning now to FIG. 3, greater detail is shown of the kinematic contact of the preferred embodiment. FIG. 3 shows body 302 coupled to body 304. Ball portion 306 is mounted to body 302.

Ball portion 306 has a curved portion 316 adapted to contact tapered surface 314 in grooved block 308. Ball portion 306 need not be fully spherical. Regions of ball portion 306 which do not contact grooved block 308 may be any shape to facilitate manufacture. Here, plug portion 318 is adapted to fit into recess 320 to hold ball portion 306 in place.

Post 310 extends through ball portion 306. Post 310 has a threaded end 324 which is screwed to body 302. Flange 322 on post 310 aids in holding ball portion 306 to body 302.

Grooved block 308 contains a recess 312. Recess 312 is large enough that when curved portion 316 engages tapered surface 314, post 310 and flange 322 do not contact grooved block 308.

Grooved block 308 is mounted to body 304. Post 310 extends into body 304 and mates with quick connect coupling 330. Coupling 330 is any coupling which can grab post 310, pull on it and release it. Couplings performing these motions with the fewest motions possible are preferred.

One coupling suitable for use as quick connect coupling 330 is a quick connect coupling as is sometimes used to connect an air hose to a compressor. It has an inner sleeve 332 and an outer sleeve 334. Outer sleeve 334 slides relative to inner sleeve 332. Outer sleeve 334 is connected to inner sleeve 332 by a spring which urges outer sleeve 334 downwards.

Quick connect coupling 330 also includes ball 340. Usually, three or four such balls are included, but only one is shown for clarity. FIG. 3 shows ball 340 engaged in recess 342 of post 310 with outer sleeve 334 holding ball 340 in place.

Inner sleeve 332 is connected to plunger 344. Plunger 344 is in turn connected to linear actuator 346. Linear actuator may be any device which can depress plunger 344 towards post 310 and to pull back on plunger 344 with a constant force. Here, a pneumatic cylinder is used.

In operation, post 310 is inserted into body 304. Post 310 presses against ball 340. Ball 340 causes outer sleeve 334 to ride up relative to inner sleeve 332. When outer sleeve rides up far enough to clear ball 340, ball 340 slides away from post 310. Post 310 can then move past ball 340 and ball 340 can slide into recess 342. The spring loaded force on outer sleeve 334 then pulls outer sleeve 334 back down, forcing ball 340 into recess 342. Outer sleeve 334 slides down sufficiently far to prevent ball 340 from coming out of recess 342, thereby locking post 310 in place.

With ball 340 engaged in recess 342, actuator 346 then pulls upwards on plunger 344 with a predetermined amount of force. As plunger 344 is connected to quick connect coupling 330 which is in turn connected to post 310, this upward force pulls ball portion 306 against grooved block 308. Thus, the contact force at the kinematic contact is the force provided by linear actuator 346. To have repeatable positioning, it is important that the contact force at each kinematic contact be repeatable.

Actuator 346 and quick connect coupling 330 are preferably mounted such that the only force they exert on post 310 is along the axis of the post 310. To achieve this result, actuator 346 could be mounted with a ball and socket mounting or on an elastomer. Also, there should be sufficient spacing around quick connect coupling to prevent it from contacting body 304.

To release quick connect coupling 330, plunger 344 is depressed further. Both outer sleeve 334 and inner sleeve 332 are pressed downwards further than needed to engage the coupling. Downward motion of outer sleeve 334 stops when flange 336 engages tab 338. As plunger 344 is depressed further, ball 340 rolls below outer sleeve 334 and springs out of recess 342. In this way, the connection is released.

Actuator 346 can be controlled by a control system (not shown) or could operate in response to a human operator pressing various switches. In operation, it is expected that a robotic manipulator (not shown) or even a human operator bring test head 202 close enough to prober 204 that posts 284 engage quick connect couplings inside test head 202. Thereafter, the manipulator would exert as little force as possible on test head 202 such that all contact forces were supplied by the actuators. In this fashion, part-per-million repeatability can be obtained.

ALTERNATIVE EMBODIMENTS

Figure 4A:
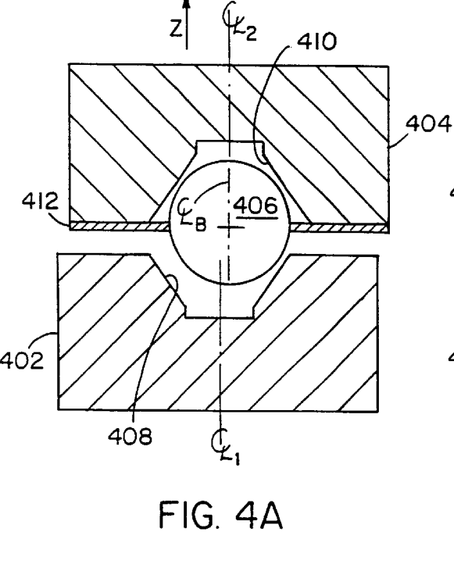
FIGS. 4A through 4C are cross sectional views of a coupling according to an alternative embodiment of the invention.

FIG. 4A shows an alternative embodiment of a kinematic contact. A body 402 is coupled to a body 404. Body 402 has a groove 408 formed in it. Body 404 has a groove 410 formed in it.

Ball 406 is attached over groove 410 on flexural bearing 412. A flexural bearing resembles a thin sheet of metal. Flexural bearing 412 allows ball 406 to move in the direction labeled Z. However, it does not allow motion in any direction perpendicular to the direction Z.

Figure 4B:
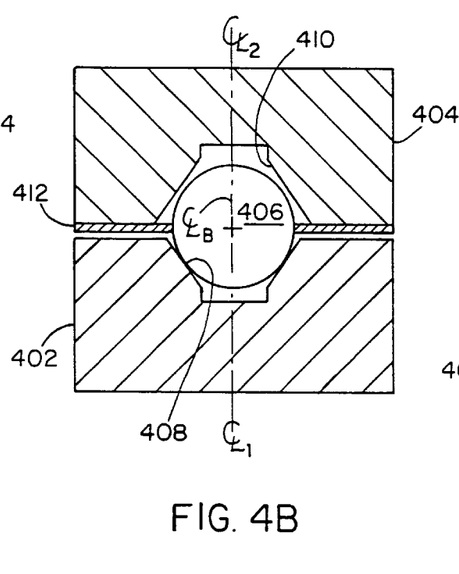
Figure 4C:
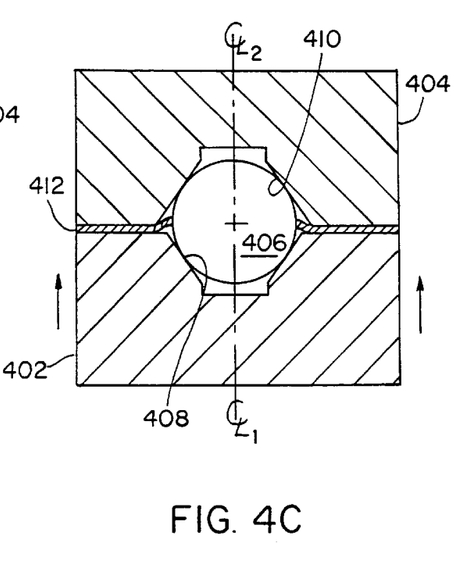

The center line $CL_B$ of ball 406 is aligned with the center line $CL_2$ of groove 410. In operation, bodies 402 and 404 are brought together. Ball 406 will first settle into groove 408 and align the center line $CL_1$ of groove 408 with the center line $CL_B$ of ball 406, as shown in FIG. 4B. As bodies 402 and 404 are brought closer together, ball 406 will be pressed into groove 410, as shown in FIG. 4C. Once ball 406 engaged groove 408 as in FIG. 4B, all further motion of bodies 404 and 402 is in the Z direction. No perpendicular motion is permitted.

FIG. 4 does not explicitly show how the force is applied to to bring bodies 402 and 404 together. A post passing through ball 406 as shown in FIG. 3 might be used.

Other methods of allowing only one directional motion of ball 406 could be employed. For example, ball 406 could ride on a post extending from the floor of groove 410. In that embodiment, ball 406 might be biased away from body 404 by a spring or some other mechanism.

The kinematic coupling of FIG. 4 is particularly useful for interfaces using spring pins. With such a coupling, once the test head is close enough to the prober to put force on the spring pins, no lateral movement of the pins will be permitted. Damage to contact pads by the spring pins is thereby avoided.

Various changes and substitutions could also be made to the disclosed preferred embodiments without departing from the invention. For example, FIG. 3 shows a pneumatic actuator used to apply a preload force to a kinematic contact. Any other means of applying a preload force could be used.

Also, various manufacturing tolerances are listed throughout the description. A functioning device could be made even if these tolerances are not strictly observed, though it might have less accuracy than described. Likewise, a device could be made with greater tolerances and should have greater accuracy.

Balls and grooves are shown as the kinematic contacts. The position of the balls and grooves could be interchanged. For example, grooves 282 could be mounted on prober 204 and balls 280 could be mounted on test head 202. Also, the kinematic contacts need not be limited to balls and grooves. Any kinematic contacts forming a kinematic coupling could be used.

Further, the disclosed embodiment shows an outer kinematic coupling test head 202 to prober 204 and an inner kinematic coupling probe card 228 to test head 202. Benefits could be obtained by using only one of these couplings.

Also, FIG. 2 shows a zero insertion force ring used to implement a zero insertion force socket. Other types of zero insertion force sockets could be used. For example, some zero insertion force sockets are implemented by squeezing a post inserted into the socket between two conductive members. One conductive member is connected to a lever and moves towards the other when the lever is moved.

Further, a probe card with probe wires was illustrated. The invention can be used regardless of the method used to probe a device. For example, the invention works equally well if a conductive membrane or blades are used for probing a wafer.

Additionally, probe cards and device interface boards were illustrated as being printed circuit boards. Any substrate which carries conductive paths might be used.

It should also be noted that the invention was illustrated when used to interface a test head to a prober. The invention may also be used as an interface to a handler for packaged IC parts. If used with a handler, there might be no need for a probe card. Traditionally, handlers plug packaged parts into sockets mounted to the device interface board. Also, handlers generally are oriented vertically whereas probers generally are oriented horizontally. The interface of the invention is useful in all orientations.

It is felt, therefore, that the invention should be limited only by the spirit and scope of the appended claims.

What is claimed is:

1. A mechanical interface used in a semiconductor test system designed to provide rapid and repeatable connection of a first component and a second component in the test system, the mechanical interface comprising:

a) a plurality of contacts, each contact comprising:
   i) a first contact element on the first component of the test system;

ii) a second contact element on the second component in the test system;

iii) wherein the first and second contact elements are shaped and positioned to engage one another in a contact constraining motion in at least two degrees of freedom while allowing motion with at least two other degrees of freedom;

b) means for latching the first component and the second component and drawing the first component and the second component together to a final position determined by the positioning of the plurality of contacts.

2. The mechanical interface of claim 1 wherein the plurality of contacts form a kinematic contact.

3. The mechanical interface of claim 1 wherein:

a) the means for latching comprises a plurality of linear actuators attached to the first component, each such linear actuator having a coupling thereon, the coupling attached to the actuator to be moved to at least a first position and a second position by the actuator, the means for latching further comprising a member, attached to the second component, for engaging the coupling,;

b) the first position is defined by engaging the member to the coupling while the coupling is in the first position; and c) the second position is defined by actuating the linear actuator to move the coupling to the second position.

4. The mechanical interface of claim 1 wherein the first component of the semiconductor test system comprises a tester and the second component comprises a handling device.

5. The mechanical interface of claim 1 wherein the first component comprises a test head and the second component comprises a probe card.

6. The mechanical interface of claim 1 wherein the each of the first contact elements has a curved portion and each of the second contact elements has a groove with at least two sides formed therein and the curved portion of the first contact element fits into the groove in the second contact element and makes contact with said two surfaces of the groove.

7. The mechanical interface of claim 1 wherein the means for latching comprises a linear actuator with a quick connect coupling attached thereto.

* * * * *